US012604414B2

(12) United States Patent
Chen et al.

(10) Patent No.: US 12,604,414 B2
(45) Date of Patent: Apr. 14, 2026

(54) TEMPORARY CARRIER PLATE AND MANUFACTURING METHOD THEREOF, AND MANUFACTURING METHOD FOR PACKAGING SUBSTRATE

(71) Applicant: Nantong ACCESS Semiconductor CO., LTD., Jiangsu Province (CN)

(72) Inventors: Xianming Chen, Jiangsu Province (CN); Jindong Feng, Jiangsu Province (CN); Lei Feng, Jiangsu Province (CN); Jiangjiang Zhao, Jiangsu Province (CN); Yue Bao, Jiangsu Province (CN); Benxia Huang, Jiangsu Province (CN); Yejie Hong, Jiangsu Province (CN)

(73) Assignee: Nantong ACCESS Semiconductor CO., LTD., Jiangsu Province (CN)

( * ) Notice: Subject to any disclaimer, the term of this patent is extended or adjusted under 35 U.S.C. 154(b) by 894 days.

(21) Appl. No.: 17/684,582

(22) Filed: Mar. 2, 2022

(65) Prior Publication Data

US 2022/0287184 A1     Sep. 8, 2022

(51) Int. Cl.
| | |
|---|---|
| *H05K 3/00* | (2006.01) |
| *H05K 3/02* | (2006.01) |
| *H05K 3/06* | (2006.01) |
| *H05K 3/46* | (2006.01) |
| *H10W 74/01* | (2026.01) |

(52) U.S. Cl.
CPC ............. *H05K 3/007* (2013.01); *H05K 3/025* (2013.01); *H05K 3/064* (2013.01); *H05K 3/4658* (2013.01); *H10W 74/019* (2026.01)

(58) Field of Classification Search
None
See application file for complete search history.

(56) References Cited

U.S. PATENT DOCUMENTS

| | | | |
|---|---|---|---|
| 10,692,830 B2 * | 6/2020 | Dadvand ................. | H01L 24/13 |
| 12,302,508 B2 * | 5/2025 | Chen .................... | H05K 1/0366 |
| 2015/0282301 A1 * | 10/2015 | Nishida .................. | H05K 1/115 156/247 |

FOREIGN PATENT DOCUMENTS

JP          2017157700 A  *  9/2017

* cited by examiner

*Primary Examiner* — Daniel J. Schleis
(74) *Attorney, Agent, or Firm* — The PL Law Group, PLLC

(57) ABSTRACT

A temporary carrier plate according to an embodiment of the present disclosure includes a first carrier core layer, a first copper foil layer on the first carrier core layer, a second carrier core layer on the first copper foil layer, and a second copper foil layer on the second carrier core layer, wherein the first copper foil layer includes physically press-fitted first outer-layer copper foil and first inner-layer copper foil, and the second copper foil layer includes physically press-fitted second outer-layer copper foil and second inner-layer copper foil.

9 Claims, 8 Drawing Sheets

TEMPORARY CARRIER PLATE AND MANUFACTURING METHOD THEREOF, AND MANUFACTURING METHOD FOR PACKAGING SUBSTRATE

CROSS-REFERENCE TO RELATED APPLICATION

This application claims the benefit under 35 USC § 119 of Chinese Patent Application No. 202110245694.5, filed on Mar. 5, 2021, in the China Intellectual Property Office, the entire disclosure of which is incorporated herein by reference for all purposes.

BACKGROUND

1. Technical Field

Embodiments of the present description relate to the technical field of semiconductors, and more particularly to a temporary carrier plate and a manufacturing method thereof, and a manufacturing method for a packaging substrate by using the temporary carrier plate.

2. Description of the Related Art

As the trend of miniaturization and portability of electronic systems advances, all devices of electronic products today seek to be light, thin, short, and small, to occupy the minimal space and achieve the most powerful functions. So the circuit boards loading devices are also required to be thinner and thinner. The traditional circuit board process uses a core substrate as a circuit board, and with the improvement of the circuit board processing capability, the thickness of the core substrate can be about 0.06 mm, for example. However, during the manufacturing of the process, the equipment capacity is insufficient and it is difficult to transfer such a light and thin board. Moreover, the operation of the upper board and lower board by the personnel will also bring the risk of uncontrollable board breaking and folding, thereby greatly reducing the product yield. At the same time, the subsequent packaging process is to package the device onto the thin board so that both the operational feasibility and production yield are greatly restricted. For this reason, the carrier plate technology comes into being. Such carrier plate only plays the role of temporary reinforcement and support, and the carrier plate can be removed after the substrate or packaging process is completed.

Currently, a metal carrier plate, such as a copper plate, is commonly used as a temporary carrier plate. In order to balance the support strength and cost, the metal carrier plate has a thickness of 0.2 mm-0.3 mm, so that in the procedure of removing the metal carrier plate by subsequent etching, an etching amount of at least 0.25-0.35 mm is required to complete the etching, and the etching solution can easily crack or erode through the line layer or the copper pillar layer above via the defect positions such as projections and recesses existing on the surface of the metal plate. Since the coreless substrate is generally provided with a thin line layer (10-40 μm) and copper pillar (30-100 μm), which are much smaller than the etching amount of the etched carrier plate, the product manufactured using the metal carrier plate has severe defects.

In addition, the metal carrier plate with a thickness of 0.2 mm-0.3 mm is heavy, making it difficult for manual handling, and equipment absorption and transfer, which is not conducive to mass production. Moreover, the cost is also high.

In addition, the prior art also offers a technical solution of using a copper-clad plate as a temporary carrier plate. Since a heat-resistant film capable of selectively bonding a copper-clad plate without bonding with a subsequently press-fitted insulating layer is introduced on the copper-clad plate, such a heat-resistant film cannot directly be used as an embedded line due to direct press-fitting the insulating layer, which has limitations in product design, and has high cost and is difficult to be popularized due to the need for a whole set of new equipment and supporting medicament.

SUMMARY

In view of the above, it is an object of the present description to propose a temporary carrier plate that can manufacture an ultra-thin substrate and be used for packaging, and a manufacturing method of the temporary carrier plate, thereby overcoming the defects in the prior art. Another object of the present invention is to provide a method for manufacturing a packaging substrate by using the temporary carrier plate.

In view of the above object, in a first aspect, one or more embodiments of the present description provide a temporary carrier plate including a first carrier core layer, a first copper foil layer on the first carrier core layer, a second carrier core layer on the first copper foil layer, and a second copper foil layer on the second carrier core layer; wherein the first copper foil layer includes physically press-fitted first outer-layer copper foil and first inner-layer copper foil, and the second copper foil layer includes physically press-fitted second outer-layer copper foil and second inner-layer copper foil.

In some embodiments, the first copper foil layer is provided on two sides of the first carrier core layer respectively, the second carrier core layer is provided on both of the first copper foil layers, and the second copper foil layer is provided on the surface of the second carrier core layer.

In some embodiments, the first carrier core layer includes an epoxy fiberglass cloth laminate plate and an epoxy layer on the surface of the epoxy fiberglass cloth laminate plate, and the second carrier core layer includes an epoxy layer.

In some embodiments, the thickness of the first outer-layer copper foil is greater than that of the first inner-layer copper foil.

In some embodiments, the first outer-layer copper foil has a thickness of 15 to 20 micrometers and the first inner-layer copper foil has a thickness of 2 to 5 micrometers.

In some embodiments, the thickness of the second outer-layer copper foil is less than that of the second inner-layer copper foil.

In some embodiments, the second outer-layer copper foil has a thickness of 2 to 5 micrometers and the second inner-layer copper foil has a thickness of 15 to 20 micrometers.

In some embodiments, the lateral dimension of the first outer-layer copper foil is less than the lateral dimension of the first inner-layer copper foil, thereby exposing a first outer edge region of the first inner-layer copper foil; the lateral dimension of the second outer-layer copper foil is less than the lateral dimension of the second inner-layer copper foil, thereby exposing a second outer edge region of the second inner-layer copper foil.

In some embodiments, the lateral dimension of the second outer-layer copper foil is less than the lateral dimension of the first outer-layer copper foil such that the lateral dimension of the second outer edge region is greater than the lateral dimension of the first outer edge region.

In some embodiments, a first etch barrier layer and a second etch barrier layer are applied to outer surfaces of the first copper foil layer and the second copper foil layer, respectively, such that the first etch barrier layer covers the first outer-layer copper foil and the first outer edge region, and the second etch barrier layer covers the second outer-layer copper foil and the second outer edge region.

In some embodiments, the etch barrier layer includes a nickel layer and a copper layer.

In a second aspect, an embodiment of the present description provides a manufacturing method for a temporary carrier plate, including the steps of:

(a) press-fitting a first copper foil layer respectively on two surfaces of a first carrier core layer, wherein the first copper foil layer includes physically press-fitted first outer-layer copper foil and first inner-layer copper foil;

(b) coating a first photoresist layer on the first copper foil layer and patterning to expose a peripheral edge of the first outer-layer copper foil, and etching the exposed first outer-layer copper foil until a first outer edge region of the first inner-layer copper foil is exposed;

(c) removing the first photoresist layer and applying a first etch barrier layer on the surface of the first copper foil layer such that the first etch barrier layer covers the first outer edge region and the first outer-layer copper foil;

(d) successively press-fitting a second carrier core layer and a second copper foil layer respectively on the surface of the first etch barrier layer, wherein the second copper foil layer includes physically press-fitted second outer-layer copper foil and second inner-layer copper foil;

(e) coating a second photoresist layer on the second copper foil layer and patterning to expose the peripheral edge of the second outer-layer copper foil, and etching the exposed second outer-layer copper foil until a second outer edge region of the second inner-layer copper foil is exposed, wherein the lateral dimension of the second outer edge region is less than the lateral dimension of the first outer edge region;

and (f) removing the second photoresist layer and applying a second etch barrier layer on the surface of the second copper foil layer such that the second etch barrier layer covers the second outer edge region and the second outer-layer copper foil.

In some embodiments, the first carrier core layer includes an epoxy fiberglass cloth laminate plate and an epoxy layer press-fitted on the surface of the epoxy fiberglass cloth laminate plate, and the second carrier core layer includes an epoxy layer.

In some embodiments, the thickness of the second outer-layer copper foil is less than that of the second inner-layer copper foil.

In some embodiments, the thickness of the first outer-layer copper foil is greater than that of the first inner-layer copper foil.

In a third aspect, an embodiment of the present description provides a method for manufacturing a packaging substrate, including the steps of:

manufacturing a substrate on the surface of the temporary carrier plate as described in any one of the preceding items;

integrally cutting along a cutting line between the first outer-layer copper foil edge and the second outer-layer copper foil edge; separating the first outer-layer copper foil and the first inner-layer copper foil to remove a first carrier core layer; and mounting a device on the substrate and packaging the same;

integrally cutting along a cutting line in the inner side of the second outer-layer copper foil edge;

and separating the second outer-layer copper foil and the second inner-layer copper foil to remove a second carrier core layer. In some embodiments, the method further includes:

after removing the second carrier core layer, etching to remove the second outer-layer copper foil and the etch barrier layer on the bottom surface of the substrate.

It can be seen from the above that one or more embodiments of the present description provide a temporary carrier plate including a first carrier core layer, a first copper foil layer on the first carrier core layer, a second carrier core layer on the first copper foil layer, and a second copper foil layer on the second carrier core layer; wherein the first copper foil layer includes physically press-fitted first outer-layer copper foil and first inner-layer copper foil, and the second copper foil layer includes physically press-fitted second outer-layer copper foil and second inner-layer copper foil.

The advantages are that 1) the temporary carrier plate of the present invention includes a first carrier core layer and a second carrier core layer, and the manufacturing process of the substrate and the device mounting and packaging process are respectively performed on carrier plates with different thicknesses by means of a secondary plate separation, which can ensure that an ultra-thin substrate obtains sufficient rigidity during the manufacturing process, and the device packaging process can be performed on a relatively thin carrier plate by means of a primary plate separation, so that the thickness and weight of the substrate are not too large during the packaging process, so as to meet the equipment requirements for mounting a device with a relatively large thickness or weight on the ultra-thin substrate; it can obtain sufficient rigidity during the whole procedure to reduce the possibility of a broken plate and folded plate, and it also can avoid excessive thickness and weight, and meet the compatibility of the existing equipment; 2) sealing the inner-layer copper foil edge and outer-layer copper foil edge via etching the barrier layer can prevent the penetration of water vapor and the like into the gap of the double-layer copper foil during the processing, thereby preventing the risk of plate burst during the processing; 3) by narrowing inwardly from a first edge region of the first copper foil layer to a second edge region of the second copper foil layer, it is convenient to achieve secondary plate separation by stepwise cutting without affecting the sealing of the double-layer copper foil, so that the plate separation operation is simplified and the risk of plate burst caused by plate separation is reduced; 4) by using the difference in etching speed between the etch barrier layer and the copper foil, the wrong etching of the bottom surface of the substrate during the etching of the copper foil on the bottom surface of the substrate can be prevented, which is beneficial to improve the yield of the substrate. Therefore, the temporary carrier plate of the present invention can realize the support and protection of the whole process of manufacturing and mounting and packaging a substrate. At the same time, it improves the compatibility of equipment, facilitates manual handling, equipment transfer, and other operations, reduces the manufacturing difficulty, and improves the yield. Besides, the temporary carrier plate of the present invention also has the advantages of low manufacturing cost and high output.

BRIEF DESCRIPTION OF THE DRAWINGS

In order to more clearly illustrate one or more embodiments of the present description or the technical solutions in the prior art, a brief description will be given below with reference to the accompanying drawings which are required to be used in the description of the embodiments or the prior art. It is obvious that the accompanying drawings in the description below are merely one or more embodiments of the present description and that other drawings can be obtained according to these drawings by a person of ordinary skills in the art without involving any inventive effort.

DETAILED DESCRIPTION OF THE INVENTION

The object, technical solutions, and advantages of the present description will become more apparent from the detailed description set forth below when taken in conjunction with the specific embodiments and the accompanying drawings.

It should be noted that, unless otherwise defined, technical or scientific terms used in one or more embodiments of the present description shall have the ordinary meaning as understood by one of ordinary skills in the art to which this description belongs. The use of the terms "first", "second", and the like in one or more embodiments herein does not denote any order, quantity, or importance, but rather is used to distinguish different constituent parts. The terms "comprising", "comprises", "including", "includes", and the like, mean that the elements or items preceding the terms encompass the elements or items listed after the terms and equivalents thereof, and do not exclude other elements or items.

The embodiments of the present description relate to a temporary carrier plate for manufacturing and packaging an ultra-thin substrate, and the temporary carrier plate functions as temporary support as an initial support plate of a coreless substrate manufacturing process.

Figure 1:
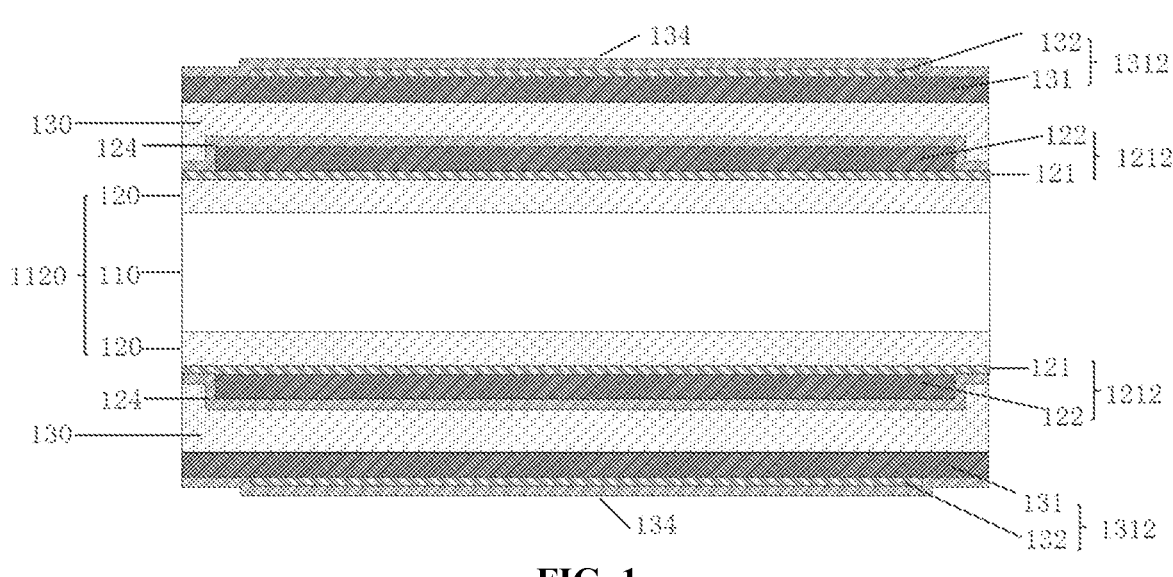
FIG. 1 is a schematic cross-sectional view of a temporary carrier plate provided in one or more embodiments of the present description.

As shown in FIG. 1, the temporary carrier plate includes a first carrier core layer 1120, a first copper foil layer 1212 on the first carrier core layer 1120, a second carrier core layer 130 on the first copper foil layer 1212, and a second copper foil layer 1312 on the second carrier core layer 130; wherein the first copper foil layer 1212 includes physically press-fitted first outer-layer copper foil 122 and first inner-layer copper foil 121, and the second copper foil layer 1312 includes physically press-fitted second outer-layer copper foil 132 and second inner-layer copper foil 131. Generally, physical press-fitting means that there is no chemical bond therebetween but merely physical attachment, which may facilitate operations of plate separation and the removal of the carrier core layer for the subsequent processing.

It can be seen therefrom that the temporary carrier plate provided in an embodiment of the present description includes a first carrier core layer 1120 and a second carrier core layer 130, and the manufacturing procedure of the substrate and the device mounting and packaging procedure are respectively performed on carrier plates with different thicknesses by means of a secondary plate separation, which can not only ensure that the ultra-thin substrate obtains sufficient rigidity during the manufacturing procedure, but also can enable the device packaging procedure to be performed on a thin carrier plate by means of primary plate separation, so that the thickness and weight of the substrate are not too large during the packaging procedure, so as to meet the equipment requirements for mounting devices with a large thickness or weight on the ultra-thin substrate. Therefore, adequate rigidity can be achieved throughout to reduce the possibility of broken and folded plates, and excessive thickness and weight can be avoided, thereby meeting the compatibility of the existing equipment.

In some embodiments, the first copper foil layer 1212 is provided on two sides of the first carrier core layer 1120 respectively, the second carrier core layer 130 is provided on both of the first copper foil layers, and the second copper foil layer 1312 is provided on the surface of the second carrier core layer 130. In this way, two sides of the temporary carrier plate are enabled to perform layer-adding preparation of the substrate, thereby improving the production rate.

Given the combination of thickness requirements and costs, the material of the first carrier core layer 1120 is shown to be an organic resin. For example, thermosetting organic resin includes, but is not limited to, prepreg, pelliculat resin ABF, and the like. As another example, thermoplastic organic resin includes, but is not limited to, polyethylene, polypropylene, and the like.

In some embodiments, the first carrier core layer 1120 includes an epoxy fiberglass cloth laminate plate (FR-4) 110 and an epoxy layer 120 on the surface of the epoxy fiberglass cloth laminate plate 110, and the second carrier core layer 130 includes an epoxy layer. Generally, the epoxy resin plate 120 may be press-fitted to the epoxy fiberglass cloth laminate plate.

It needs to be noted that the thickness and dimension of the epoxy fiberglass cloth laminate plate 110 are selected according to design requirements, and are not specifically limited herein.

In some embodiments, the thickness of the first outer-layer copper foil 122 is greater than the thickness of the first inner-layer copper foil 121. In some embodiments, the thickness of the second outer-layer copper foil 132 is less than the thickness of the second inner-layer copper foil 131.

With this arrangement, the first outer-layer copper foil 122 of greater thickness continues to remain on the second carrier core layer 130 after the first carrier core layer 1120 is removed, advantageously increasing the support strength of the second carrier core layer 130. The second inner-layer copper foil 131 having a greater thickness can be simultaneously removed when the second carrier core layer 130 is removed so that the second outer-layer copper foil 132 of smaller thickness remains on the substrate, facilitating the subsequent removal by the etching process, with very little etching amount and low etching costs, and without damaging the substrate located above.

In some embodiments, the first outer-layer copper foil 122 has a thickness of 15 to 20 micrometers and the first inner-layer copper foil 121 has a thickness of 2 to 5 micrometers. Alternatively, the first outer-layer copper foil 122 has a thickness of 18 micrometers and the first inner-layer copper foil 121 has a thickness of 3 micrometers.

In some embodiments, the second outer-layer copper foil 132 has a thickness of 2 to 5 micrometers and the second inner-layer copper foil 131 has a thickness of 15 to 20 micrometers. Alternatively, the second outer-layer copper foil 132 has a thickness of 3 micrometers and the second inner-layer copper foil 131 has a thickness of 18 micrometers.

The first outer-layer copper foil 122 and the first inner-layer copper foil 121 may be separated from an edge and the second outer-layer copper foil 132 and the second inner-layer copper foil 131 may be separated from an edge due to repeated thermal stress (for example, press-fit and metal sputtering processes) and mechanical stress (for example, plate grinding and polishing processes) during the manufacturing and packaging of the ultra-thin substrate. In particular, in the process of electroplating, etching, film stripping, etc. with liquid medicine, the gap separated between the first outer-layer copper foil 122 and the first inner-layer copper foil 121 as well as the gap separated between the second outer-layer copper foil 132 and the second inner-layer copper foil 131 retain water vapor, which is likely to cause the double-layer copper foil to burst in the middle of the process (explosive plate), thereby leading to a complete failure of the product.

Therefore, in some embodiments, the lateral dimension of the first outer-layer copper foil 122 is less than the lateral dimension of the first inner-layer copper foil 121, thereby exposing a first outer edge region of the first inner-layer copper foil 121; the lateral dimension of the second outer-layer copper foil 132 is less than the lateral dimension of the second inner-layer copper foil 131, thereby exposing a second outer edge region of the second inner-layer copper foil 131. Alternatively, a first etch barrier layer 124 and a second etch barrier layer 134 are applied to outer surfaces of the first copper foil layer 1212 and the second copper foil layer 1312, respectively, such that the first etch barrier layer 124 covers the first outer-layer copper foil 122 and the first outer edge region, and the second etch barrier layer 134 covers the second outer-layer copper foil 132 and the second outer edge region. Such a technical solution can completely seal the edge of the double-layer copper foil to prevent the ingress of water vapor, effectively improve the bonding strength of the two, and avoid the separation of the inner copper foil and the outer copper foil.

Alternatively, the etch barrier layers (the first etch barrier layer 124 and the second etch barrier layer 134) include a nickel layer. Alternatively, the etch barrier layer includes a nickel layer and a copper layer.

In some embodiments, the second outer-layer copper foil 132 has a smaller lateral dimension than the first outer layer.

The copper foil 122 has a lateral dimension such that the lateral dimension of the second outer edge region is greater than the lateral dimension of the first outer edge region. In this manner, it can be ensured that the seal of the second copper foil layer 1312 is not broken during removal of the first carrier core layer 1120, thereby effectively avoiding plate bursting and separation of the second copper foil layer 1312 during the subsequent packaging procedure.

It should be understood that generally, one substrate includes a plurality of packages. Referring to FIG. 2G, as one alternative embodiment, the second outer-layer copper foil 132 includes a plurality of sub-regions separated from each other, and the second etch barrier layer 134 covers the sub-regions and the second inner-layer copper foil 131 not covered by the sub-regions, thereby achieving separate sealing protection for each package.

Figure 2A:
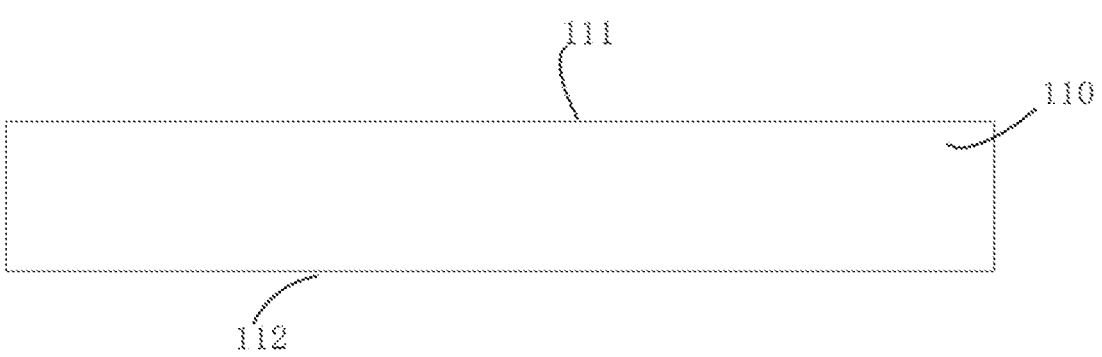
FIGS. 2A-2G are schematic cross-sectional views of manufacturing steps of a temporary carrier plate provided in one or more embodiments of the present description.
Figure 2B:
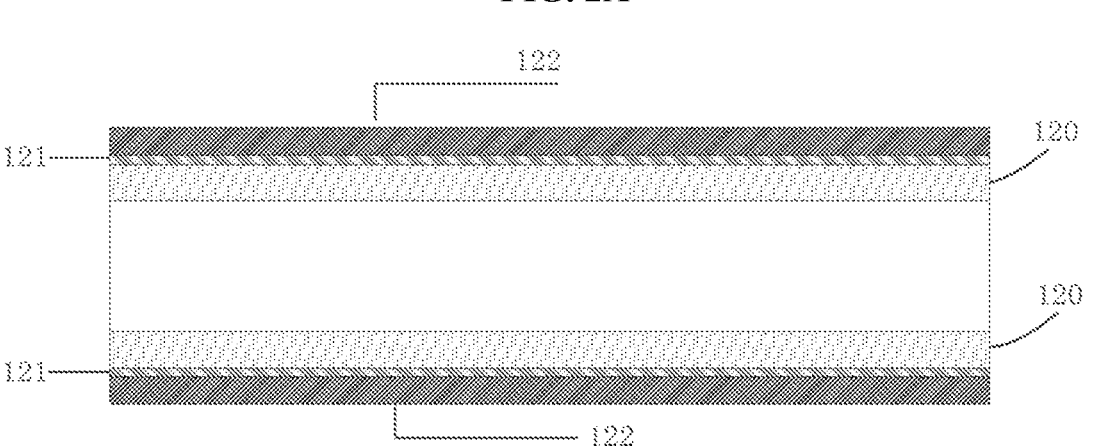
Figure 2C:
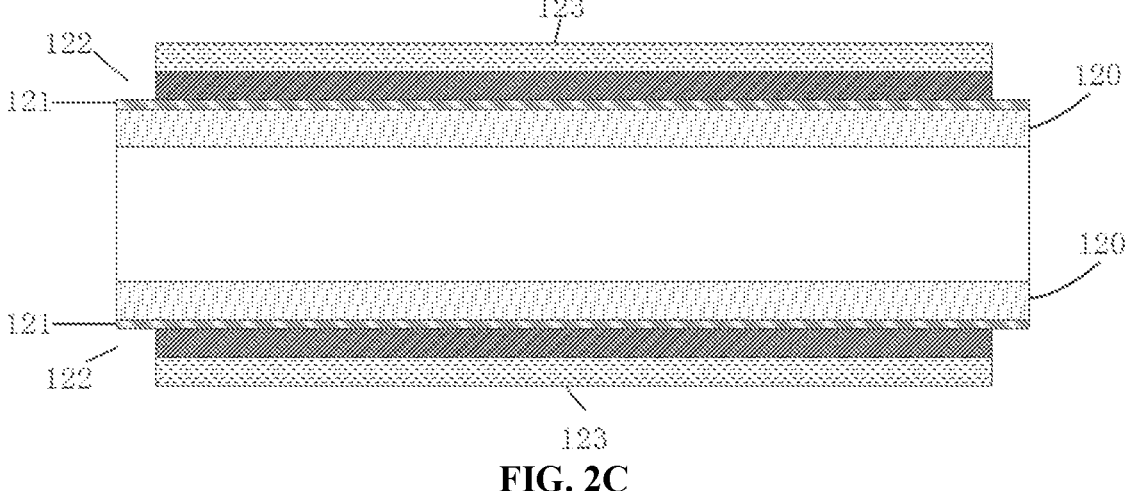
Figure 2D:
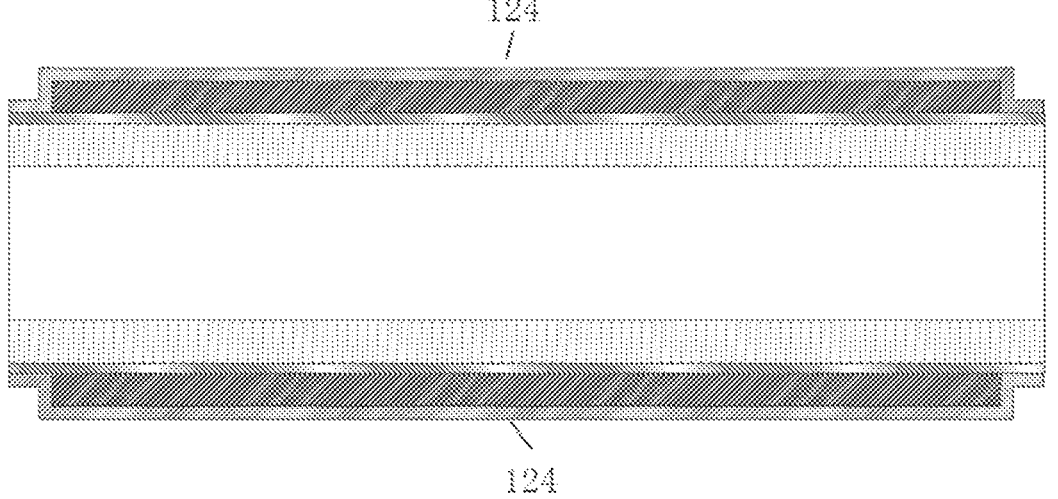
Figures 2E, 2F:
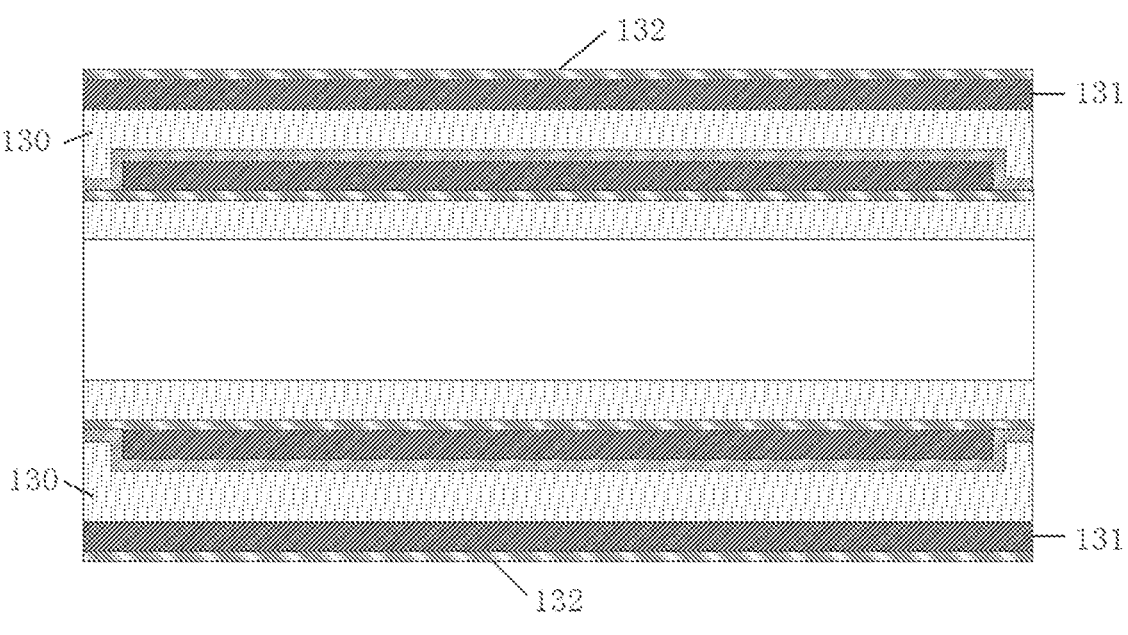
Figure 2G:
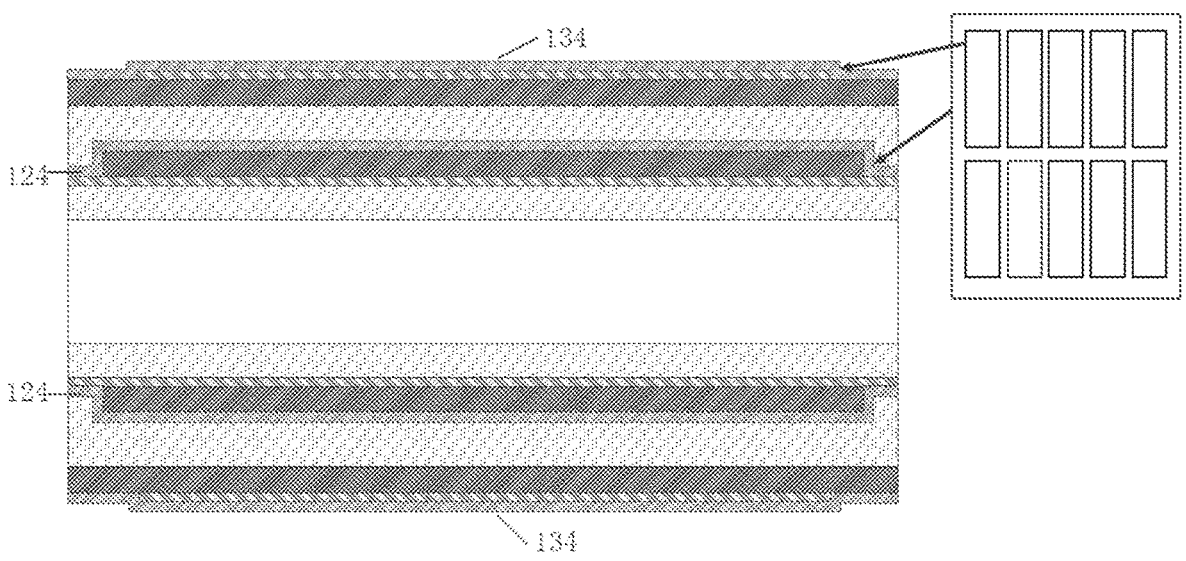

FIGS. 2A-2G are schematic cross-sectional views of manufacturing steps of a temporary carrier plate provided in one or more embodiments of the present description. With reference to FIGS. 2A-2G, the manufacturing method for a temporary carrier plate includes the following steps: press-fitting a first copper foil layer on two surfaces of a first carrier core layer, respectively, wherein the first copper foil layer includes physically press-fitted first outer-layer copper foil 122 and first inner-layer copper foil 121, step (a), as shown in FIG. 2B.

Generally, referring to FIGS. 2A and 2B, the first carrier core layer includes an epoxy fiberglass cloth laminate plate 110 and an epoxy resin layer 120 press-fitted on the surface of the epoxy fiberglass cloth laminate plate 110, wherein FIG. 2A shows a first surface 111 and a second surface 112 of the epoxy fiberglass cloth laminate layer 110 oppositely provided. Here, the thickness and dimension of the epoxy fiberglass cloth laminate plate 110 are specifically tailored according to different requirements.

In some embodiments, the thickness of the first outer-layer copper foil is greater than that of the first inner-layer copper foil. Illustratively, the first inner-layer copper foil 121 may have a thickness of 2-5 micrometers, preferably 3 micrometers; the first outer-layer copper foil 122 has a copper foil thickness of 15-20 micrometers, preferably 18 micrometers. Next, a first photoresist layer 123 is coated on the first copper foil layer and patterned to expose a peripheral edge of the first outer-layer copper foil 122, and the exposed first outer-layer copper foil 122 is etched until a first outer edge region of the first inner-layer copper foil 121 is exposed, step (b), as shown in FIG. 2C. It should be noted that the width of the outer edge region to the plate edge is generally smaller than the inactive region of the plate graph, for example, in the case of a panel of 510×410 mm, the panel has an active region of 500×400 mm, and the width of the inactive region in both X and Y directions is 10 mm, so that the width of the outer edge region in X and Y directions may be 2-6 mm. The dimension of the outer edge region can be determined according to actual circumstances, and is not limited by the embodiment.

It should be understood that the photoresist includes a photosensitive dry film or a liquid photoresist; PCB photoresist is also known as photoresist or photoresist agent, which is changed into an etching-resistant thin-film material through illumination or irradiation of ultraviolet light, deep ultraviolet light, electron beam, ion beam, X-ray, etc. so as to play the role of protecting and shielding the underlying structure. Some embodiments of the present application preferably use photosensitive dry film.

In an embodiment of the present description, the photoresist may use a low-cost product without the need for high resolution rate, generally 15-25 micrometers in thickness, to allow short film stripping reaction time.

Then, the first photoresist layer 123 is removed and a first etch barrier layer 124 is applied on the surface of the first copper foil layer such that the first etch barrier layer 124 covers the first outer edge region and the first outer-layer copper foil, step (c), as shown in FIG. 2D.

In some embodiments, the etch barrier layer may be, for example, a nickel layer having a thickness of 5-10 micrometers. Generally, to avoid oxidation and contamination of the surface of the nickel layer, a copper layer of 2-5 micrometers is applied after electroplating the nickel layer. The etch barrier layer mainly serves to seal the first copper foil layer and the second copper foil layer, and prevents the outer-layer copper foil and the inner-layer copper foil from delaminating or invading into water vapor and the like in the middle of the processing.

Next, a second carrier core layer 130 and a second copper foil layer are sequentially press-fitted on the surface of the first etch barrier layer 124, respectively, wherein the second copper foil layer includes physically laminated second outer-layer copper foil 132 and second inner-layer copper foil 131, step (d), as shown in FIG. 2E.

In some embodiments, the second carrier core layer includes an epoxy resin layer.

In some embodiments, the thickness of the second outer-layer copper foil 132 is smaller than that of the second inner-layer copper foil 131. Illustratively, the second inner-layer copper foil 131 may have a thickness of 15-20 micrometers, preferably 18 micrometers; the second outer-layer copper foil 132 has a copper foil thickness of 2-5 micrometers, preferably 3 micrometers.

Then, a second photoresist layer 133 is coated on the second copper foil layer and patterned to expose the peripheral edge of the second outer-layer copper foil 132, and the exposed second outer-layer copper foil is etched until a second outer edge region of the second inner-layer copper foil 131 is exposed, wherein the lateral dimension of the second outer edge region is smaller than the lateral dimension of the first outer edge region, step (e), as shown in FIG. 2F.

Finally, the second photoresist layer 133 is removed and a second etch barrier layer 134 is applied on the surface of the second copper foil layer such that the second etch barrier layer 134 covers the second outer edge region and the second outer-layer copper foil, step (f), as shown in FIG. 2G.

In some embodiments, the outer-layer copper foil 132 of the second copper foil layer is divided into a plurality of sub-regions separated from each other by etching, the second etch barrier layer covering the sub-regions and a second inner-layer copper foil not covered by the sub-regions.

Figure 3A:
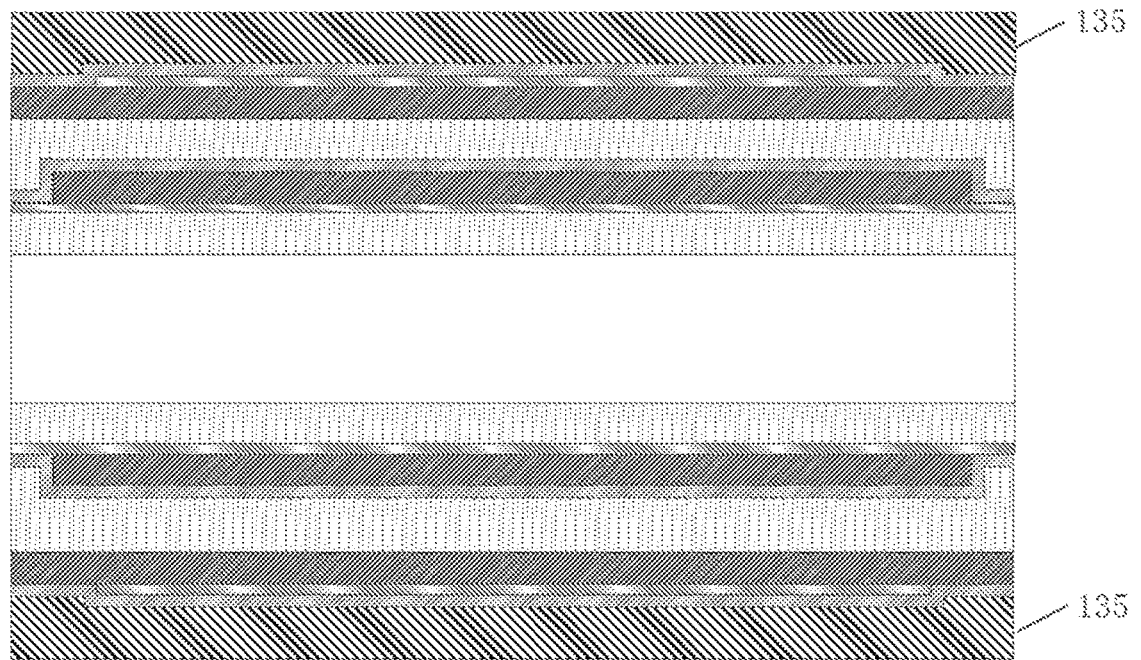
FIGS. 3A-3H are schematic cross-sectional views of steps provided by one or more embodiments of the present description for manufacturing a packaging substrate by using a temporary carrier plate of an embodiment of the present description.

FIGS. 3A-3H are schematic cross-sectional views of steps provided by one or more embodiments of the present description for manufacturing a packaging substrate by using the temporary carrier plate of an embodiment of the present description. Referring to FIGS. 3A-3H, the manufacturing method includes steps as follows: a substrate 135 is manufactured on the surface of the temporary carrier plate as described in any of the foregoing items, as shown in FIG. 3A. Here, the substrate 135 can be designed according to actual needs, and can be a single-layer board, a double-sided board, and a multi-layer board; the thinnest thickness can be 20 micrometers or even thinner.

Figures 3B, 3C:
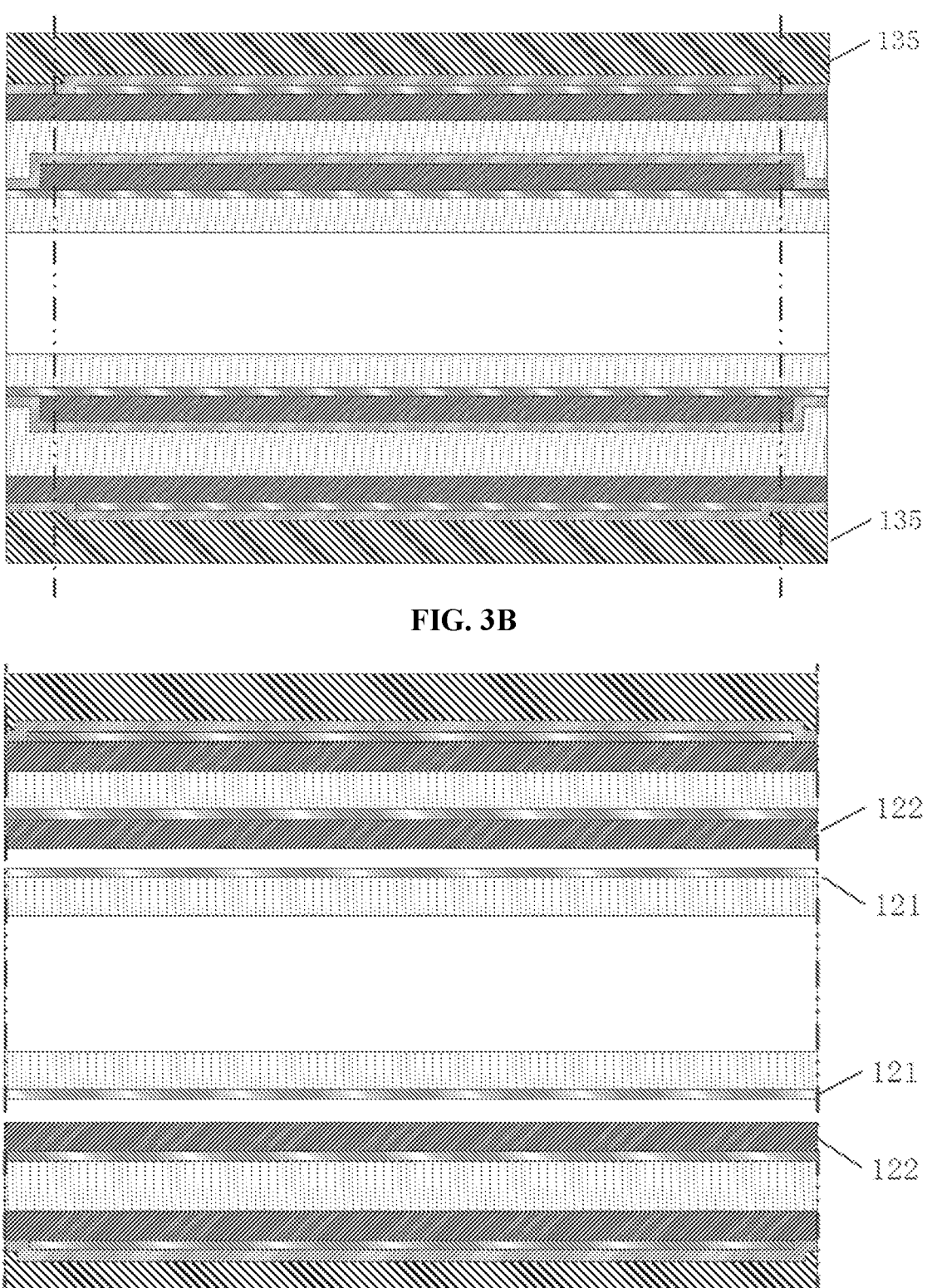

Next, an integral cut is made along a cutting line between the first outer-layer copper foil edge and the second outer-layer copper foil edge, see FIG. 3B. By cutting, the seal between the first outer-layer copper foil 122 and the first inner-layer copper foil 121 is released to facilitate the separation of the first outer-layer copper foil 122 and the first inner-layer copper foil 121.

Figure 3D:
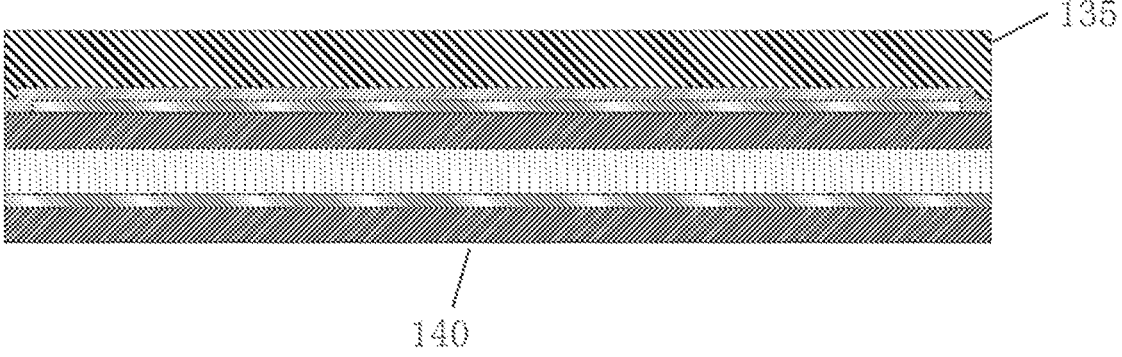

The first outer-layer copper foil 122 and the first inner-layer copper foil 121 are then separated to remove the first carrier core layer, see FIG. 3C. Therefore, two support plates 140 can be obtained by one temporary carrier plate, as shown in FIG. 3D. From this point on, the number of support plates to be processed becomes twice the number of the initial feed in the subsequent process for the support plate, significantly improving production efficiency.

Here, the support plate 140 includes a second carrier core layer, a second copper foil layer, and a substrate 135. The support plate 140 can be safely carried by means of the support function of the second carrier core layer, and is not easy to fold, and does not have severe plate twisting. By removing the first carrier core layer 1120, the mass of the temporary carrier plate can be reduced, facilitating subsequent packaging operations to obtain the final product. Here, the substrate 135 may be an ultra-thin substrate.

Figure 3E:
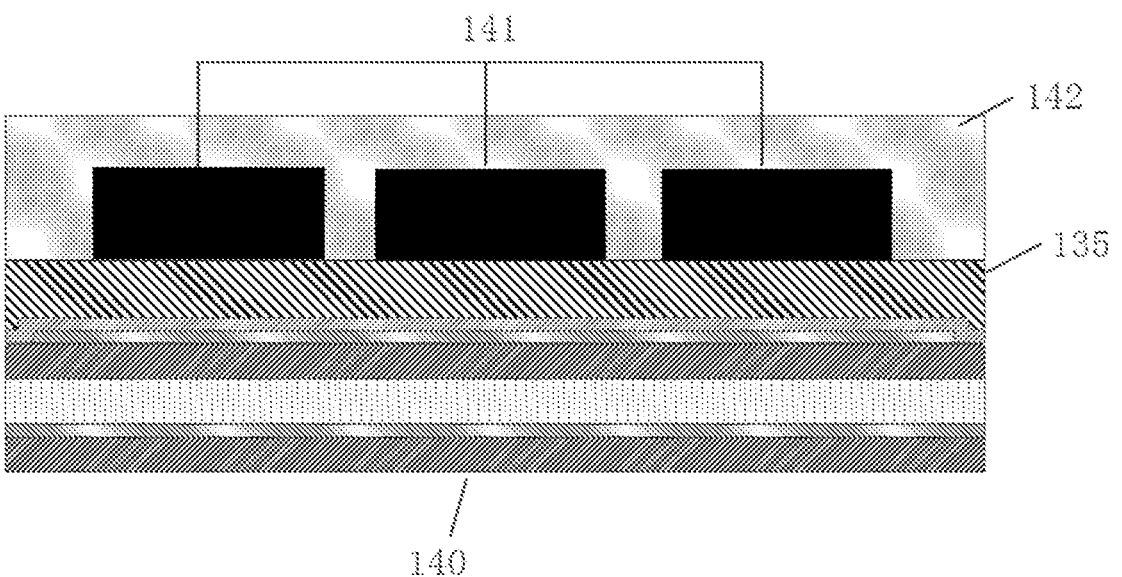

Next, a device 141 is mounted on the substrate 135 and packaged, see FIG. 3E. Generally, the packaging layer 142 is formed via packaging.

Figure 3F:
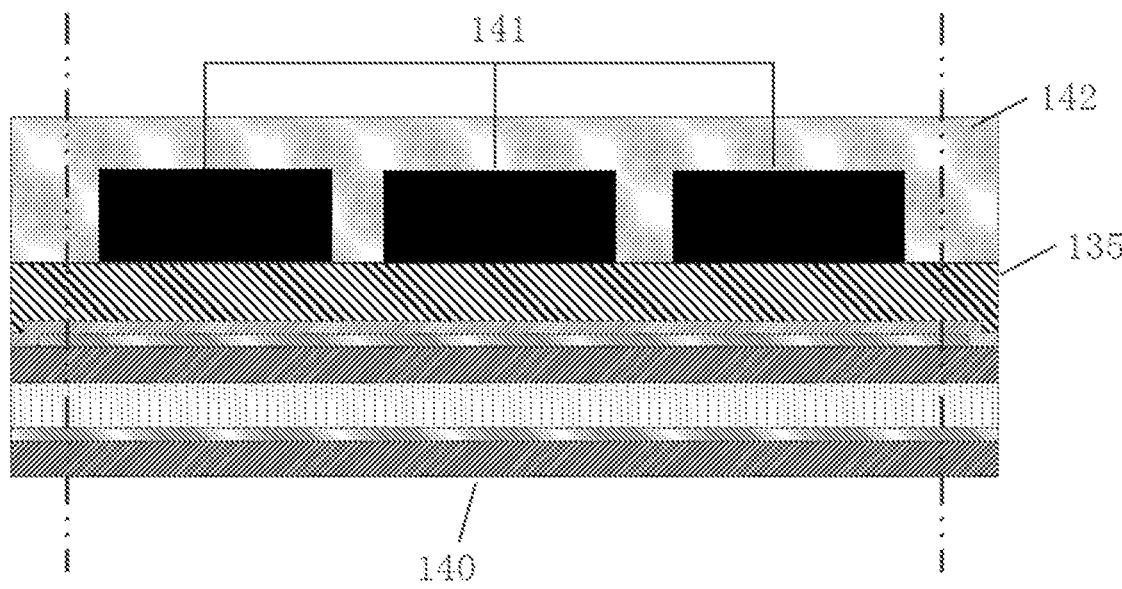

Then, integral cutting is carried out along the cutting line on the inner side of the second outer-layer copper foil edge, see FIG. 3F. Here, the cutting line is located on the inner side of the second outer-layer copper foil so as not to damage the circuit or device on the substrate, and it is not limited to the specific description. The separation of the second outer-layer copper foil 132 from the second inner-layer copper foil 131 is facilitated by cutting to remove the seal between the second outer-layer copper foil 132 and the second inner-layer copper foil 131.

Figure 3G:
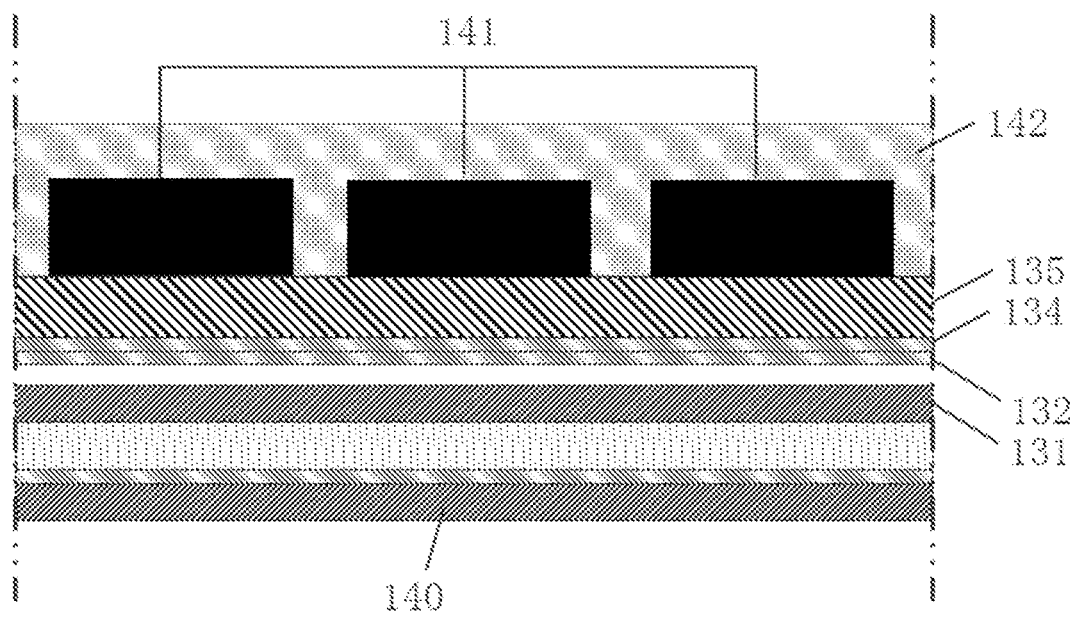

Next, the second outer-layer copper foil 132 and the second inner-layer copper foil 131 are separated to remove the second carrier core layer, see FIG. 3G.

In an embodiment of the present description, the plate separating operation can be achieved simply by applying a mechanical external force at the bonding edge of the double-layer copper foil. For example, the second copper foil layer is fixed on the mesa and an external force is applied to the packaging layer at an included angle of 30°~60° to achieve the separation.

In some embodiments, the method further includes:

after removing the second carrier core layer, etching to remove the second outer-layer copper foil on the bottom surface of the substrate. By using the difference in etching speed between the etching barrier layer and the copper foil, the wrong etching of the bottom surface of the substrate during the etching of the copper foil on the bottom surface of the substrate can be prevented, which is beneficial to improve the yield of the substrate.

Figure 3H:
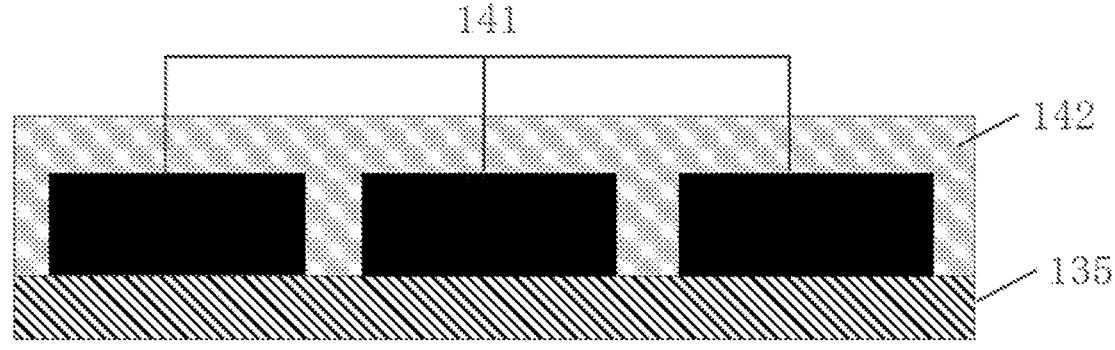

In some embodiments, the method further includes etching to remove the second etch barrier layer 134 on the bottom surface of the substrate to obtain a final package product, as shown in FIG. 3H.

The temporary carrier plate of the embodiments of the present description can be prepared by using common equipment, procedures, parameters, and conventional materials, and is simple, easy, and at low cost.

Those of ordinary skills in the art should understand that the discussion of any embodiment above is merely exemplary and is not intended to imply that the scope of the description (including the claims) is limited to these examples; combinations of technical features in the above embodiments, or between different embodiments, may also be made under the concept of the present description, the steps may be implemented in any order, and there may be many other variations, which are not provided in detail for clarity, of the aforementioned different aspects of one or more embodiments of the present description.

While the present description has been described in conjunction with specific embodiments thereof, many replacements, modifications, and variations of these embodiments will be apparent to those of ordinary skills in the art in light of the foregoing description.

According to one or more embodiments of the present description, it is intended to embrace all such replacements, modifications, and variations as fall within the broad scope of the appended claims. Accordingly, any omissions, modifications, equivalents, improvements, etc. made should be included within the scope of the present description as long as they are within the spirit and principles of one or more embodiments of the present description.

What is claimed is:

1. A temporary carrier plate, comprising:

a first carrier core layer;

a first copper foil layer on the first carrier core layer;

a second carrier core layer on the first copper foil layer; and a second copper foil layer on the second carrier core layer, wherein the first copper foil layer comprises physically press-fitted first outer-layer copper foil and first inner-layer copper foil, and the second copper foil layer comprises physically press-fitted second outer-layer copper foil and second inner-layer copper foil, wherein a lateral dimension of the first outer-layer copper foil is less than the lateral dimension of the first inner-layer copper foil, thereby exposing a first outer edge region of the first inner-layer copper foil; the lateral dimension of the second outer-layer copper foil is less than the lateral dimension of the second inner-layer copper foil, thereby exposing a second outer edge region of the second inner-layer copper foil;

wherein the lateral dimension of the second outer-layer copper foil is less than the lateral dimension of the first outer-layer copper foil such that the lateral dimension of the second outer edge region is greater than the lateral dimension of the first outer edge region.

2. The temporary carrier plate according to claim 1, wherein the first copper foil layers are provided on two sides of the first carrier core layer respectively, the second carrier core layers are provided on both of the first copper foil layers, and the second copper foil layer is provided on a surface of the second carrier core layer.

3. The temporary carrier plate according to claim 1, wherein the first carrier core layer comprises an epoxy fiberglass cloth laminate plate and an epoxy resin layer on the surface of the epoxy fiberglass cloth laminate plate, and the second carrier core layer comprises an epoxy resin layer.

4. The temporary carrier plate according to claim 1, wherein a thickness of the first outer-layer copper foil near one side of the second carrier core layer is greater than the thickness of the first inner-layer copper foil away from one side of the second carrier core layer.

5. The temporary carrier plate according to claim 4, wherein the first outer-layer copper foil has a thickness of 15-20 micrometers and the first inner-layer copper foil has a thickness of 2-5 micrometers.

6. The temporary carrier plate according to claim 1, wherein the thickness of the second outer-layer copper foil is less than that of the second inner-layer copper foil.

7. The temporary carrier plate according to claim 1, wherein the second outer-layer copper foil has a thickness of 2-5 micrometers and the second inner-layer copper foil has a thickness of 15-20 micrometers.

8. The temporary carrier plate according to claim 1, wherein a first etch barrier layer and a second etch barrier layer are applied to outer surfaces of the first copper foil layer and the second copper foil layer, respectively, such that the first etch barrier layer covers the first outer-layer copper foil and the first outer edge region, and the second etch barrier layer covers the second outer-layer copper foil and the second outer edge region.

9. The temporary carrier plate according to claim 8, wherein the etch barrier layer comprises a nickel layer and a copper layer.

\* \* \* \* \*